United States Patent
Amikura et al.

(10) Patent No.: US 11,955,356 B2
(45) Date of Patent: Apr. 9, 2024

(54) PROCESSING SYSTEM AND TRANSFER METHOD

(71) Applicant: TOKYO ELECTRON LIMITED, Tokyo (JP)

(72) Inventors: Norihiko Amikura, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 191 days.

(21) Appl. No.: 17/511,505

(22) Filed: Oct. 26, 2021

(65) Prior Publication Data
US 2022/0130695 A1 Apr. 28, 2022

(30) Foreign Application Priority Data

Oct. 26, 2020 (JP) .................................. 2020-179160
Sep. 13, 2021 (JP) .................................. 2021-148516

(51) Int. Cl.
*H01L 21/67* (2006.01)
*H01L 21/677* (2006.01)

(52) U.S. Cl.
CPC .. *H01L 21/67196* (2013.01); *H01L 21/67259* (2013.01); *H01L 21/67742* (2013.01)

(58) Field of Classification Search
CPC .......... H01L 21/67742; H01L 21/67196; H01L 21/67167; H01L 21/67259
See application file for complete search history.

(56) References Cited

U.S. PATENT DOCUMENTS

| | | | | |
|---|---|---|---|---|
| 10,062,590 B2* | 8/2018 | Wong | ............... | H01L 21/67383 |
| 10,062,599 B2* | 8/2018 | Genetti | ............. | H01L 21/68785 |
| 10,124,492 B2* | 11/2018 | Genetti | ............... | B25J 11/0095 |
| 2020/0194296 A1* | 6/2020 | Numakura | .......... | H01L 21/6831 |
| 2020/0286752 A1* | 9/2020 | Toyomaki | .......... | H01L 21/6732 |
| 2021/0215752 A1* | 7/2021 | Ito | ..................... | H01L 21/67772 |
| 2021/0398838 A1* | 12/2021 | Amikura | ........... | H01L 21/67259 |

(Continued)

FOREIGN PATENT DOCUMENTS

| JP | 2011-54933 A | 3/2011 |
|---|---|---|
| JP | 2012-216614 A | 11/2012 |
| JP | 2018-10992 A | 1/2018 |

*Primary Examiner* — Kaitlin S Joerger
(74) *Attorney, Agent, or Firm* — XSENSUS LLP (57) ABSTRACT

There is provided a processing system. The processing system comprises: a chamber in which a consumable member is installed; a storage module configured to store the consumable member; a position detection sensor configured to detect a position of the consumable member; a vacuum transfer module connected to the chamber and the storage module, the vacuum transfer module having a transfer robot configured to transfer the consumable member between the chamber and the storage module; and a controller. The controller is configured to perform processes of: (a) controlling the transfer robot to transfer the consumable member installed in the chamber to the storage module; (b) detecting the position of the consumable member transferred to the storage module by the position detection sensor; and (c) controlling the transfer robot to transfer a new consumable member different from the consumable member from the storage module to the chamber at a position adjusted based on the position of the consumable member detected in the process (b).

18 Claims, 9 Drawing Sheets

(56) References Cited

U.S. PATENT DOCUMENTS

| | | | | |
|---|---|---|---|---|
| 2022/0130695 A1* | 4/2022 | Amikura | ............ | H01J 37/32743 |
| 2022/0230898 A1* | 7/2022 | Dogome | ............ | H01L 21/67201 |
| 2022/0246408 A1* | 8/2022 | Genetti | ................. | B65D 85/02 |
| 2023/0039017 A1* | 2/2023 | Ogawa | .............. | H01L 21/67772 |

* cited by examiner

PROCESSING SYSTEM AND TRANSFER METHOD

CROSS-REFERENCE TO RELATED APPLICATIONS

This application claims priority to Japanese Patent Application Nos. 2020-179160 filed on Oct. 26, 2020 and 2021-148516 filed on Sep. 13, 2021, respectively, the entire contents of which are incorporated herein by reference.

TECHNICAL FIELD

The present disclosure relates to a processing system and a transfer method.

BACKGROUND

A technique for replacing a focus ring disposed to surround a substrate in a processing chamber where plasma processing is applied is commonly practiced in the art (e.g., see Japanese Laid-open Patent Publication Nos. 2012-216614, 2018-010992, and 2011-054933).

SUMMARY

The present disclosure provides a technique for efficiently replacing a consumable member in a processing chamber.

In accordance with an aspect of the present disclosure, there is provided a processing system. The processing system comprises: a chamber in which a consumable member is installed; a storage module configured to store the consumable member; a position detection sensor configured to detect a position of the consumable member; a vacuum transfer module connected to the chamber and the storage module, the vacuum transfer module having a transfer robot configured to transfer the consumable member between the chamber and the storage module; and a controller. The controller is configured to perform processes of: (a) controlling the transfer robot to transfer the consumable member installed in the chamber to the storage module; (b) detecting the position of the consumable member transferred to the storage module by the position detection sensor; and (c) controlling the transfer robot to transfer a new consumable member different from the consumable member from the storage module to the chamber at a position adjusted based on the position of the consumable member detected in the process (b).

DETAILED DESCRIPTION

Hereinafter, non-limiting exemplary embodiments of the present disclosure will be described with reference to the accompanying drawings. In all the accompanying drawings, for the same or corresponding members or consumable members, the same or corresponding reference numerals are assigned, and thus, a redundant description thereof will be omitted.

[Processing System]

Figure 1:
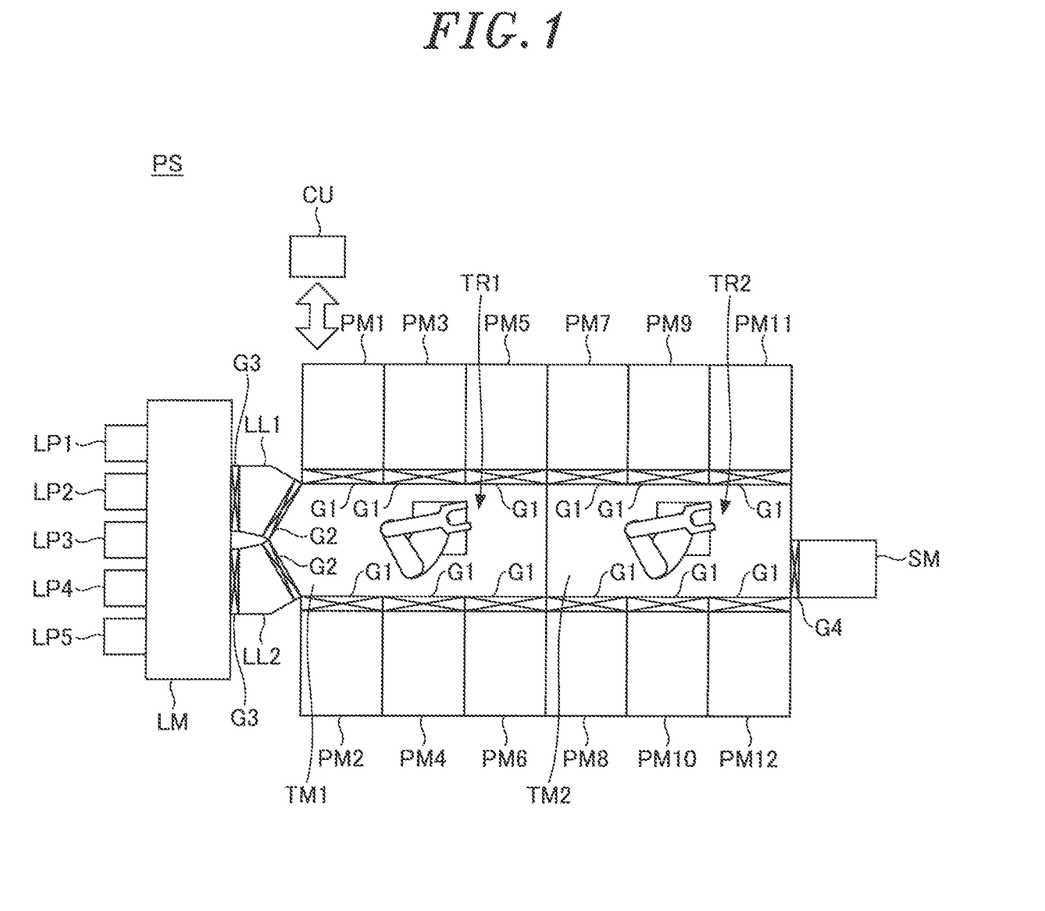
FIG. 1 is a diagram showing an example of a processing system according to an embodiment.

An example of a processing system according to an embodiment will be described with reference to FIG. 1. As shown in FIG. 1, a processing system PS is a system capable of performing various processes, such as a plasma process, on a substrate. The substrate may be, for example, a semiconductor wafer.

The processing system PS includes vacuum transfer modules TM1 and TM2, process modules PM1 to PM12, load lock modules LL1 and LL2, an atmospheric transfer module LM, a storage module SM, etc.

The vacuum transfer modules TM1 and TM2 each have a substantially quadrangular shape in a plan view. The vacuum transfer module TM1 has the process modules PM1 to PM6 on two opposite sides. The load lock modules LL1 and LL2 are connected to one of the other two opposite sides of the vacuum transfer module TM1, and a path (not shown) for connecting to the vacuum transfer module TM2 is connected to the other side. The side of the vacuum transfer module TM1 to which the load lock modules LL1 and LL2 are connected is tilted according to the load lock modules LL1 and LL2. The vacuum transfer module TM2 has the process modules PM7 to PM12 on two opposite sides. A path (not shown) for connecting to the vacuum transfer module TM1 is connected to one of the other two opposite sides of the vacuum transfer module TM2, and the storage module SM is connected to the other side. The vacuum transfer modules TM1 and TM2 each have a vacuum chamber, and transfer robots TR1 and TR2 are respectively disposed inside the vacuum chambers.

The transfer robots TR1 and TR2 have a turning member, an expandable member, and a lifting member. The transfer robots TR1 and TR2 transfer a substrate between the load lock modules LL1 and LL2 and the process modules PM1 to PM12 by mounting the substrate on a fork placed at a tip thereof. The transfer robots TR1 and TR2 transfer a consumable member between the process modules PM1 to PM12 and the storage module SM by mounting the consumable member on the fork. The consumable member is a member replaceably installed in the process modules PM1 to PM12 and is a member consumed by performing various processes such as plasma processing in the process modules PM1 to PM12. The consumable member includes, for example, an edge ring 113, a cover ring 114, and a top plate 121 of an upper electrode 12, which will be described below.

The process modules PM1 to PM12 have a processing chamber, and a stage (a mounting table) is disposed in the processing chamber. After the substrate is mounted on the stage, the process modules PM1 to PM12 depressurize the inside to introduce a processing gas, apply RF power to generate a plasma, and perform plasma processing on the substrate by the plasma. The vacuum transfer modules TM1 and TM2 and the process modules PM1 to PM12 are separated by a gate valve G1, which is a switching part. On the stage, the edge ring 113, the cover ring 114, and the like are disposed. The upper electrode 12 for applying RF power is disposed on an upper portion facing the stage.

The load lock modules LL1 and LL2 are disposed between the vacuum transfer module TM1 and the atmospheric transfer module LM. The load lock modules LL1 and LL2 have an internal-pressure variable chamber, the inside thereof being switchable between vacuum pressure and atmospheric pressure. The load lock modules LL1 and LL2 have a stage disposed therein. When the substrate is imported from the atmospheric transfer module LM to the vacuum transfer module TM1, the load lock modules LL1 and LL2 keep the inside at atmospheric pressure, receive the substrate from the atmospheric transfer module LM, depressurize the inside, and import the substrate to the vacuum transfer module TM1. When the substrate is exported from the vacuum transfer module TM1 to the atmospheric transfer module LM, the load lock modules LL1 and LL2 keep the inside at vacuum pressure, receive the substrate from the vacuum transfer module TM1, pressurize the inside at atmospheric pressure, and then import the substrate to the atmospheric transfer module LM. The load lock modules LL1 and LL2 and the vacuum transfer module TM1 are separated by a gate valve G2, which is a switching part. The load lock modules LL1 and LL2 and the atmospheric transfer module LM are separated by a gate valve G3, which is a switching part.

The atmospheric transfer module LM is disposed opposite to the vacuum transfer module TM1. The atmospheric transfer module LM may be, for example, an equipment front-end module (EFEM). The atmospheric transfer module LM is an atmospheric transfer chamber that is a rectangular parallelepiped, has a fan filter unit (FFU), and is held in an atmospheric pressure atmosphere. The two load lock modules LL1 and LL2 are connected to one side along the longitudinal direction of the atmospheric transfer module LM. Load ports LP1 to LP5 are connected to the other side along the longitudinal direction of the atmospheric transfer module LM. A container (not shown) for housing a plurality of (e.g., 25) substrates is mounted on the load ports LP1 to LP5. The container may be, for example, a front-opening unified pod (FOUP). A transfer robot (not shown) for transferring a substrate is disposed in the atmospheric transfer module LM. The transfer robot transfers a substrate between the FOUP and the internal-pressure variable chambers of the load lock modules LL1 and LL2.

The storage module SM is detachably connected to the vacuum transfer module TM2. The storage module SM has a storage chamber and stores consumable members. For example, the storage module SM is connected to the vacuum transfer module TM2 when a consumable member in the process modules PM1 to PM12 is replaced and is separated from the vacuum transfer module TM2 when the replacement of the consumable member is completed. As a result, an area around the processing system PS may be effectively utilized. However, the storage module SM may always be connected to the vacuum transfer module TM2. The storage module SM has a position detection sensor that detects the position of a consumable member stored in the storage chamber. The consumable member is transferred between the process modules PM1 to PM12 and the storage module SM by the transfer robots TR1 and TR2. The vacuum transfer module TM2 and the storage module SM are separated by a gate valve G4, which is a switching part.

A controller CU is installed in the processing system PS. The controller CU controls each part of the processing system, for example, the transfer robots TR1 and TR2 installed in the vacuum transfer modules TM1 and TM2, the transfer robot installed in the atmospheric transfer module LM, and the gate valves G1 to G4. Also, the controller CU acquires a detection value of the position detection sensor installed in the storage module SM and calculates a reference position of each process module PM1 to PM12 on the basis of the acquired detection value. The reference position will be described below. The controller CU may be, for example, a computer. The controller CU may include a central processing unit (CPU), a random access memory (RAM), a read-only memory (ROM), a secondary memory device, etc. The CPU operates based on a program stored in the ROM or the secondary memory device and controls each part of the processing system PS.

Also, in the example shown in FIG. 1, the case in which the storage module SM is connected to the opposite side of the vacuum transfer module TM1 while the vacuum transfer module TM2 is interposed therebetween has been described, but the present invention is not limited thereto. For example, the storage module SM may be connected instead of at least one of the process modules PM1 to PM12.

[Plasma Processing Device]

Figure 2:
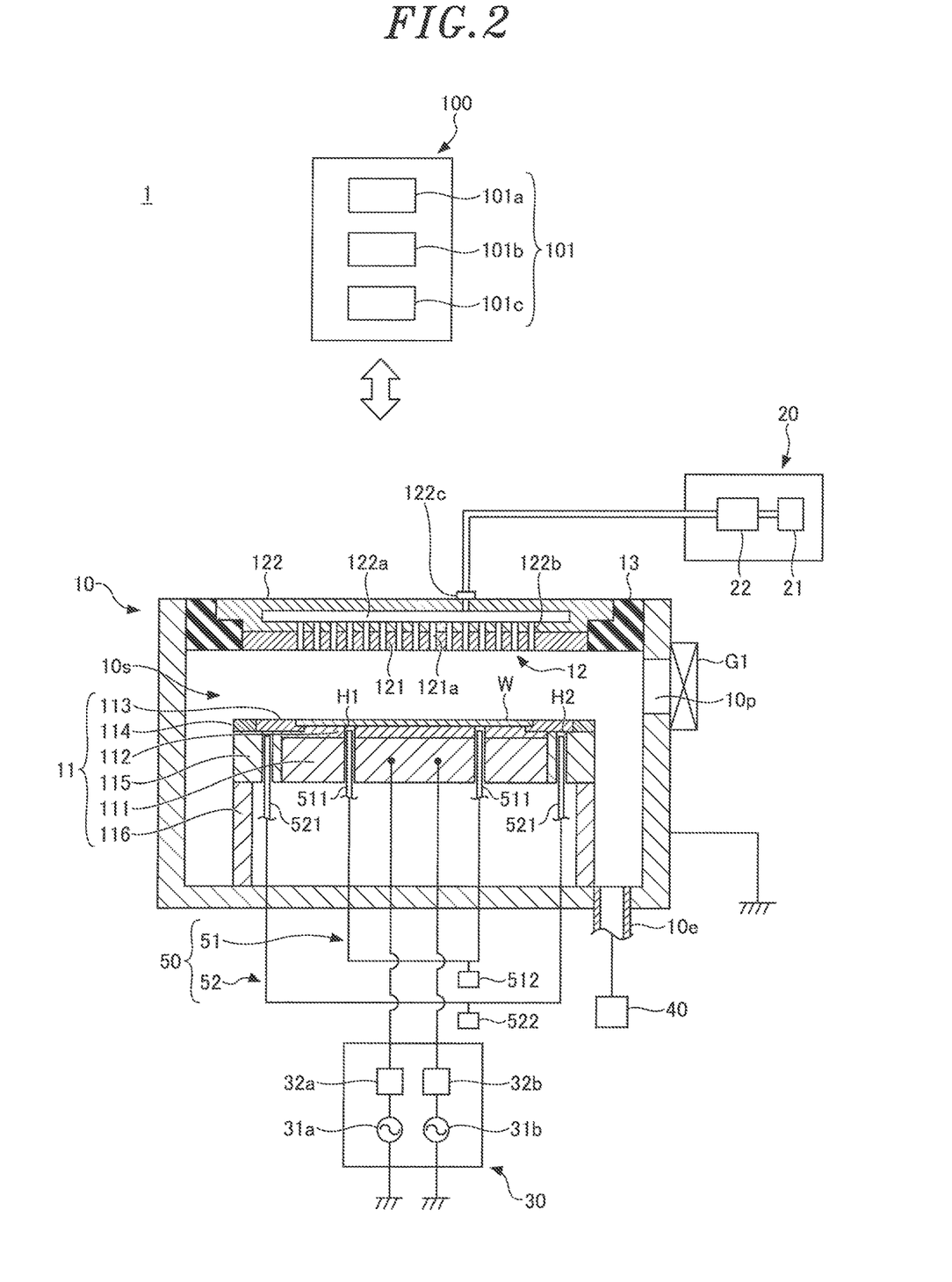
FIG. 2 is a schematic cross-sectional view showing an example of a process module.

An example of the plasma processing device used as the process modules PM1 to PM12 included in the processing system PS of FIG. 1 will be described below with reference to FIG. 2.

A plasma processing device 1 includes a chamber 10, a gas supply 20, an RF power supply 30, an exhaust 40, an elevating mechanism 50, and a controller 100.

The chamber 10 includes a support 11 and an upper electrode 12. The support 11 is disposed in a lower area of a processing space 10s in the chamber 10. The upper electrode 12 is disposed above the support 11 and may function as a part of the top plate of the chamber 10.

The support 11 supports a substrate W in the processing space 10s. The support 11 includes a lower electrode 111, an electrostatic chuck 112, an edge ring 113, a cover ring 114, an insulator 115, and a base 116. The electrostatic chuck 112 is disposed on the lower electrode 111. The electrostatic chuck 112 supports the substrate W on the upper surface. The edge ring 113 is disposed around the substrate W on the upper surface of a peripheral portion of the lower electrode 111, thereby improving the uniformity of plasma processing. The cover ring 114 is disposed on an outer peripheral portion of the edge ring 113 to protect an upper surface of the insulator 115 from a plasma. The edge ring 113 and the cover ring 114 each have an annular shape. The insulator 115 is disposed on the base 116 to surround the lower electrode 111. The base 116 is fixed to the bottom of the chamber 10 to support the lower electrode 111 and the insulator 115.

The upper electrode 12 constitutes the chamber 10 together with an insulating member 13. The upper electrode 12 supplies one or more types of processing gas from the gas supply 20 to the processing space 10s. The upper electrode 12 includes a top plate 121 and a support 122. The lower surface of the top plate 121 defines the processing space 10s. A plurality of gas discharge holes 121a are formed in the top plate 121. The plurality of gas discharge holes 121a pass through the top plate 121 in the thickness direction (vertical direction). The support 122 detachably supports the top plate 121. A gas diffusion chamber 122a is installed within the support 122. A plurality of gas holes 122b extend downward from the gas diffusion chamber 122a. The plurality of gas holes 122b respectively communicate with the plurality of gas discharge holes 121a. A gas inlet 122c is formed in the support 122. The upper electrode 12 supplies one or more types of processing gas from the gas inlet 122c to the processing space 10s through the gas diffusion chamber 122a, the plurality of gas holes 122b and the plurality of gas discharge holes 121a.

The gas supply 20 has one or more gas sources 21 and one or more flow controllers 22. The gas supply 20 supplies one or more types of processing gas from a corresponding gas source 21 to the gas inlet 122c through a corresponding flow controller 22. The flow controller 22 may be, for example, a mass flow controller or a pressure-controlled flow controller. Also, the gas supply 20 may include one or more flow modulation devices configured to modulate or pulse the flow of one or more types of processing gas.

The RF power supply 30 includes two RF power supplies (a first RF power supply 31a and a second RF power supply 31b) and two matchers (a first matcher 32a and a second matcher 32b). The first RF power supply 31a supplies first RF power to the lower electrode 111 via the first matcher 32a. The frequency of the first RF power may be, for example, 3 Hz to 3000 GHz. The second RF power supply 31b supplies second RF power to the lower electrode 111 via the second matcher 32b. The frequency of the second RF power may be, for example, 400 kHz to 13.56 MHz. Also, a DC power supply may be used instead of the second RF power supply 31b.

The exhaust 40 is connected to an exhaust port 10e installed on the bottom of the chamber 10. The exhaust 40 includes a pressure valve, a vacuum pump, and the like.

A two-way port 10p is formed on a side wall of the chamber 10. The substrate W is transferred between the processing space 10s and the outside of the chamber 10 via the two-way port 10p. The two-way port 10p is opened or closed by the gate valve G1.

The elevating mechanism 50 includes a first elevating mechanism 51 and a second elevating mechanism 52.

The first elevating mechanism 51 includes a plurality of support pins 511 and a motor 512. The plurality of support pins 511 are inserted into a through-hole H1 formed in the lower electrode 111 and the electrostatic chuck 112 and may protrude from an upper surface of the electrostatic chuck 112. By protruding from the upper surface of the electrostatic chuck 112, the plurality of support pins 511 bring their upper ends into contact with the bottom surface of the substrate W to support the substrate W. The motor 512 raises and lowers the plurality of support pins 511. The motor 512 may be a motor such as a DC motor, a stepping motor and a linear motor, a piezo actuator, an air-driven mechanism, or the like. For example, when the substrate W is transferred between the transfer robots TR1 and TR2 and the support 11, the first elevating mechanism 51 raises and lowers the plurality of support pins 511.

The second elevating mechanism 52 includes a plurality of support pins 521 and a motor 522. The plurality of support pins 521 are inserted into a through-hole H2 formed in the insulator 115 and may protrude from an upper surface of the insulator 115. By protruding from the upper surface of the insulator 115, the plurality of support pins 521 bring their upper ends into contact with the bottom surface of the edge ring 113 to support the edge ring 113. The motor 522 raises and lowers the plurality of support pins 521. The motor 522 may be a motor such as a DC motor, a stepping motor and a linear motor, a piezo actuator, an air-driven mechanism, or the like. For example, when the edge ring 113 is transferred between the transfer robots TR1 and TR2 and the support 11, the second elevating mechanism 52 raises and lowers the plurality of support pins 521.

Although not shown, an elevating mechanism for raising or lowering the cover ring 114 may be installed in the support 11. The elevating mechanism includes a plurality of support pins installed at contactable positions on the bottom surface of the cover ring 114 and a motor for raising and lowering the plurality of support pins.

The controller 100 controls each part of the plasma processing device 1. The controller 100 includes, for example, a computer 101. The computer 101 includes, for example, a CPU 101a, a memory part 101b, a communication interface 101c, etc. The CPU 101a may be configured to perform various control operations based on a program stored in the memory part 101b. The memory part 101b includes at least one memory type selected from the group consisting of secondary memory devices such as a RAM, a ROM, a Hard Disk Drive (HDD), and a Solid State Drive (SSD). The communication interface 101c may communicate with the plasma processing device 1 via a communication line such as a local area network (LAN).

[Storage Module]

Figure 3:
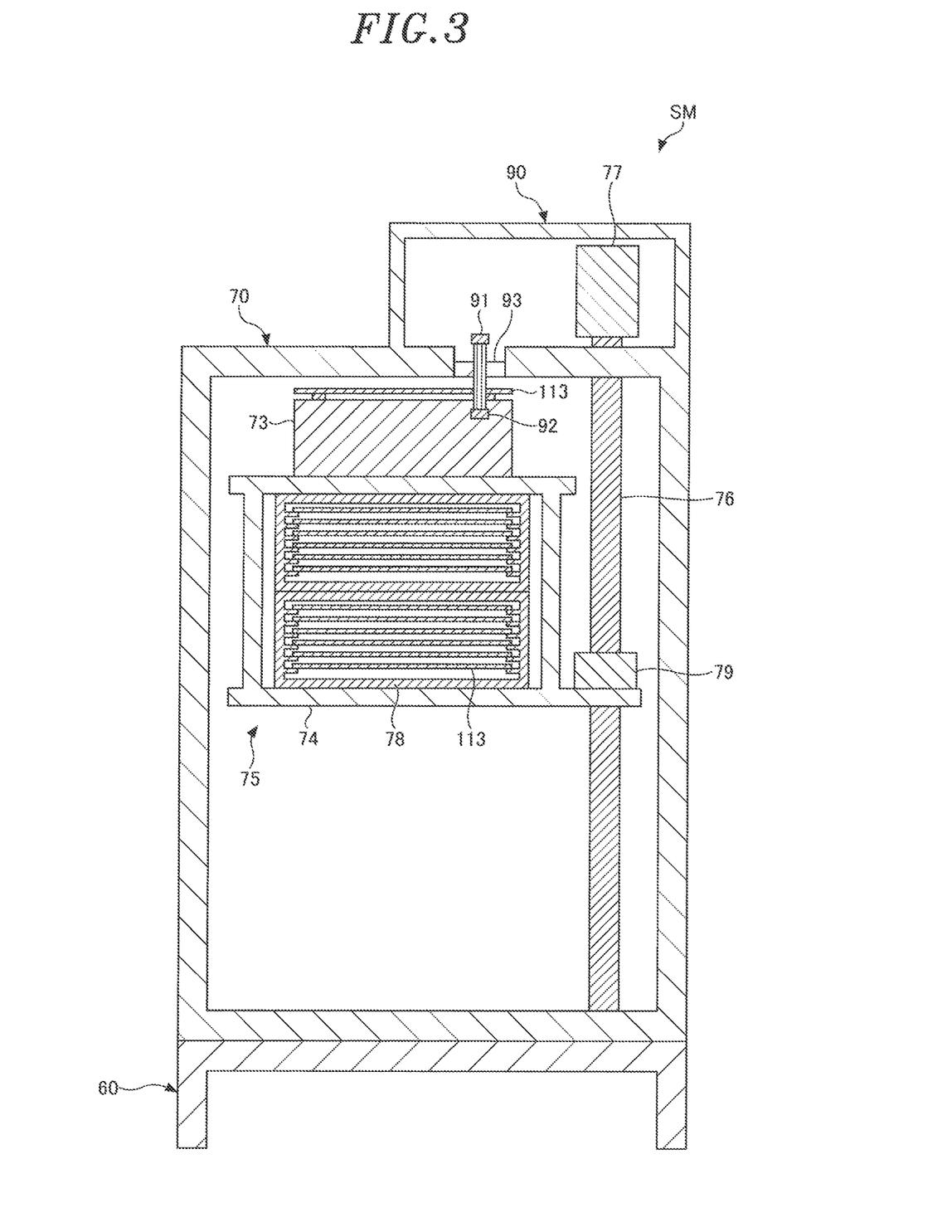
FIG. 3 is a front cross-sectional view showing an example of a storage module.
Figure 4:
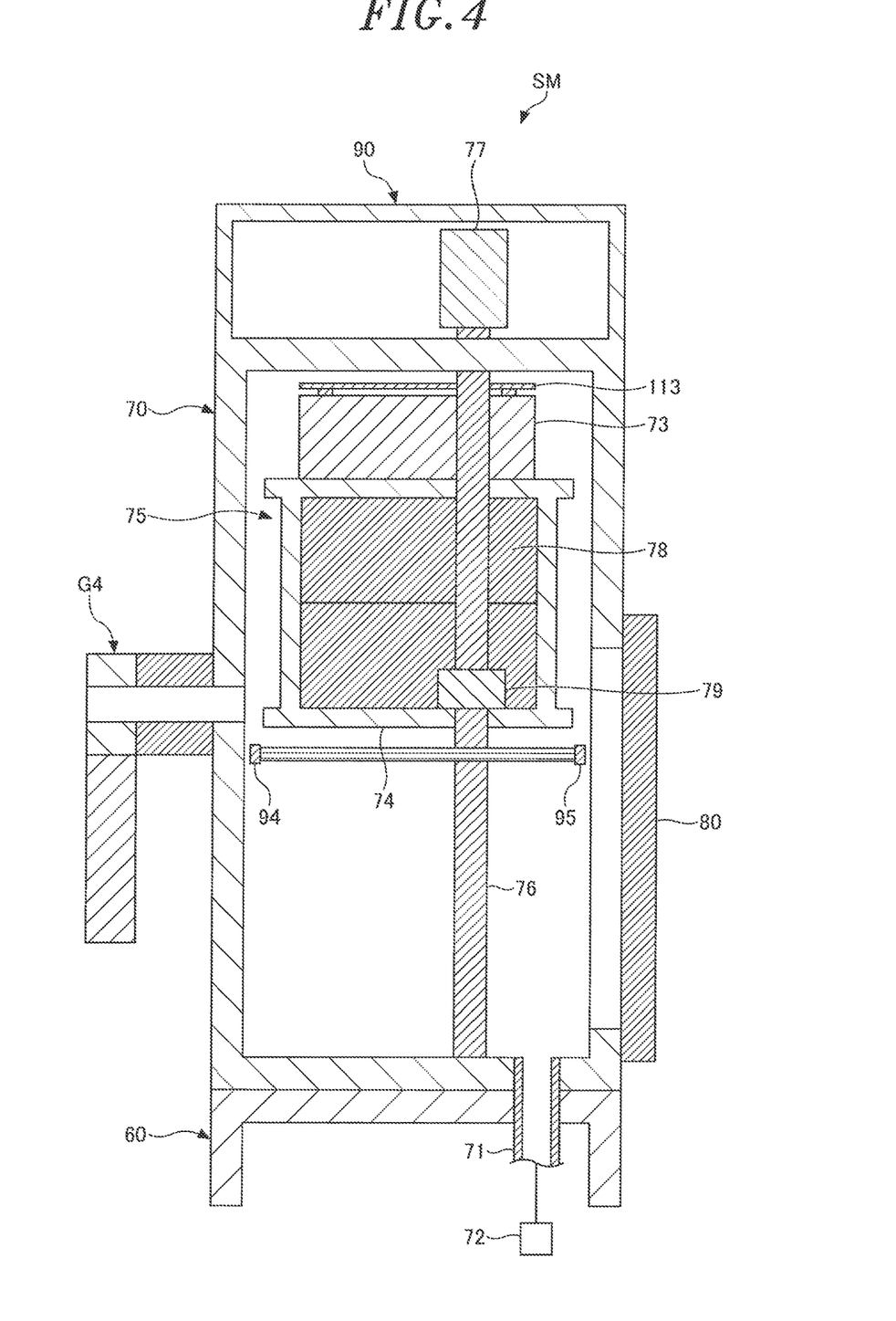
FIG. 4 is a side sectional view showing an example of a storage module.
Figure 5:
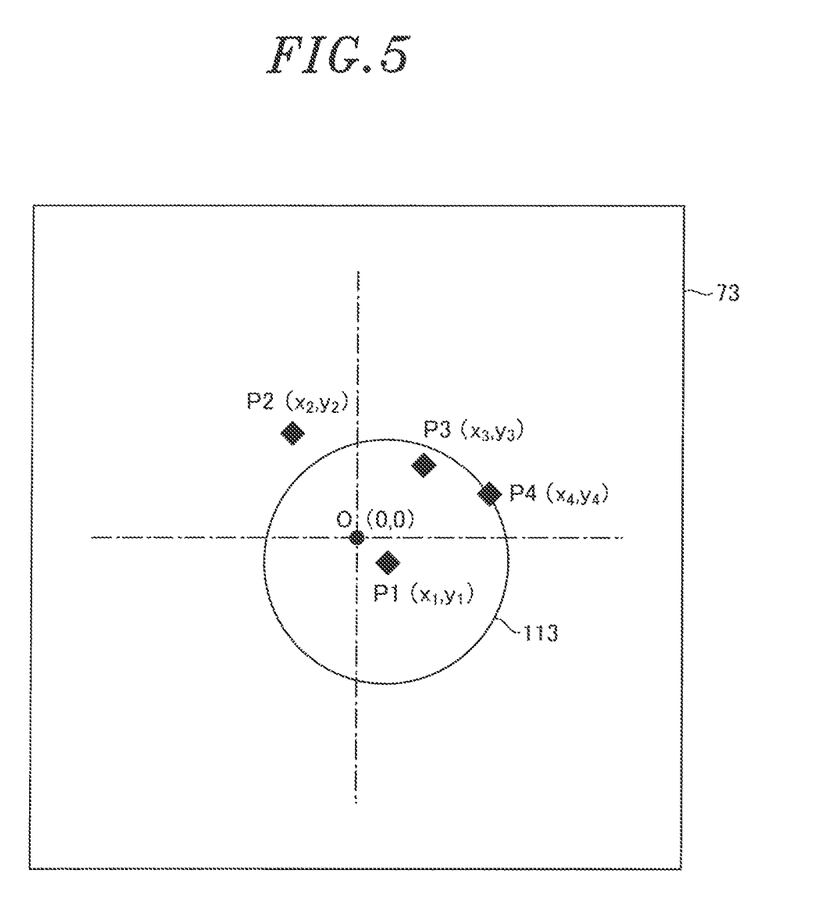
FIG. 5 is a diagram illustrating a reference position for each process module.

An example of the storage module SM included in the processing system PS of FIG. 1 will be described with reference to FIGS. 3 to 5.

In the storage module SM, a chamber 70 is installed on a frame 60, and a mechanical room 90 is provided in an upper portion of the chamber 70. The chamber 70 can depressurize the inside by an exhaust 72 connected to an exhaust port 71 installed on the bottom. Also, a purge gas, for example, $N_2$ gas, is supplied to the chamber 70. Thus, it is possible to regulate the pressure inside the chamber 70. The mechanical room 90 is, for example, in an atmospheric pressure atmosphere.

In the chamber 70, a stage 73 and a storage 75 having a basket 74 installed under the stage 73 are installed. The storage 75 may be raised and lowered by a ball screw 76. In the mechanical room 90, a line sensor 91 for detecting the position, direction, and the like of a consumable member and a motor 77 for driving the ball screw 76 are installed. A window 93 made of quartz or the like is installed between the chamber 70 and the mechanical room 90 so that the line sensor 91 can receive the light from a light-emitting part 92, which will be described below.

A consumable member is mounted on the stage 73. The stage 73 has a light-emitting part 92 opposite to the line sensor 91. The stage 73 is rotatable in the θ direction and rotates the consumable member mounted thereon, for example, the edge ring 113, in a predetermined direction. That is, the stage 73 performs the alignment (position adjustment) of the edge ring 113. For the position adjustment, the orientation flat (OF) of the edge ring 113 is adjusted in a predetermined direction. Also, the stage 73 is movable in the horizontal direction (the x or y direction) and may be configured to move the consumable member mounted thereon in the horizontal direction. Also, for the position adjustment, the center position of the edge ring 113 may be adjusted.

The line sensor 91 detects the amount of light emitted from the light-emitting part 92 and outputs the detected amount of light to the controller CU. The controller CU detects the orientation flat of the edge ring 113 using the detected amount of light which changes depending on the presence or absence of the orientation flat of the edge ring 113. The controller CU detects the direction of the edge ring 113 on the basis of the detected orientation flat. The line sensor 91 is, for example, a line sensor such as a charge-coupled device (CCD) and a complementary metal-oxide semiconductor (CMOS).

Also, the controller CU calculates information on the horizontal position (hereinafter referred to as "position information") of the edge ring 113 on the basis of the amount of light detected by the line sensor 91. The position information includes a reference position of each process module PM1 to PM7. For example, as shown in FIG. 5, the reference position may be the center positions P1(x1, y1) to P12(x12, y12) of the edge ring 113 which have been installed in the process modules PM1 to PM12 with respect to the center position O(0, 0) of the stage 73. FIG. 5 shows the center position O(0, 0) of the stage 73 and the center positions P1(x1, y1) to P4(x4, y4) when the edge ring 113 installed in the process modules PM1 to PM4 is mounted on the stage 73. Also, the controller CU generates correspondence information having the position information matched to information for the identification (hereinafter referred to as "identification information") of the process modules PM1 to PM12 in which the edge ring 113 was installed. For example, the correspondence information is recorded in the secondary memory device of the controller CU.

The basket 74 is installed under the stage 73. A cassette 78 is mounted in the basket 74. The cassette 78 may be taken out of the basket 74. The cassette 78 stores a plurality of edge rings 113 at intervals in the vertical direction. The front side and the rear side of the cassette 78 with regard to the storage module SM are open. Also, FIG. 3 shows that two cassettes 78 are mounted inside the basket 74, but for example, one cassette 78 may be mounted inside the basket 74.

In addition to the stage 73 and the basket 74, the storage 75 has a guide supported by a ball screw 76 on the side. The ball screw 76 connects an upper surface and a lower surface of the chamber 70 and is connected to the motor 77 in the mechanical room 90 through the upper surface of the chamber 70. The through-hole part of the upper surface of the chamber 70 is sealed so that the ball screw 76 is rotatable. The ball screw 76 can move the storage 75 in the vertical direction (z-axis direction) by being rotated by the motor 77.

The storage module SM is detachably connected to the vacuum transfer module TM2 via the gate valve G4. The fork of the transfer robot TR2 of the vacuum transfer module TM2 can be inserted into the chamber 70 via the gate valve G4. For example, the fork allows importing of the edge ring 113 into the cassette 78, exporting of the edge ring 113 mounted in the cassette 78, mounting of the edge ring 113 on the stage 73, and acquiring the edge ring 113 mounted on the stage 73. The door 80 is opened or closed, for example, when the cassette 78 is taken out of the chamber 70 or when the cassette 78 is installed in the chamber 70.

A light-emitting part 94 and a number detection sensor 95 detect the number of edge rings 113 mounted in the cassette 78 when the storage 75 moves the cassette 78 from the bottom of the chamber 70 upward, e.g., up to a position opposite to the gate valve G4. The light-emitting part 94 is, for example, a light-emitting diode (LED), a semiconductor laser, or the like. The number detection sensor 95 detects the amount of light emitted from the light-emitting part 94 and outputs the detected amount of light to the controller CU. The controller CU detects the number of edge rings 113 by measuring the number of times light emitted from the light-emitting part 94 is blocked by the edge ring 113 on the basis of the detected amount of light. The number detection sensor 95 is, for example, a photodiode, a phototransistor, etc. Also, the number detection sensor 95 is, for example, a line sensor such as CCD and CMOS.

Also, in the above example, the case in which the controller CU calculates the position information of the edge ring 113 based on the amount of light detected by the line sensor 91 in the storage module SM has been described, but the present disclosure is not limited thereto. For example, a position detection sensor, including an inner circumference sensor for detecting the position of an inner circumference of the edge ring 113 and an outer circumference sensor for detecting the position of an outer circumference of the edge ring 113, may be used. In this case, the controller CU calculates the position information of the edge ring 113 on the basis of the position of the inner circumference of the edge ring 113 detected by the inner circumference sensor and the position of the outer circumference of the edge ring 113 detected by the outer circumference sensor. Also, for example, instead of the line sensor 91, other optical sensors or cameras may be used. Other optical sensors or cameras may be installed in the storage module SM, as is the line sensor 91, and may also be installed to sense or capture a transfer route of the edge ring 113 (from the storage module SM to each process module PM1 to PM12). When a camera is used, the controller CU calculates the position information of the edge ring 113 on the basis of an image captured by the camera, for example, by using image processing technology.

[Transfer Method of Edge Ring]

Figure 6:
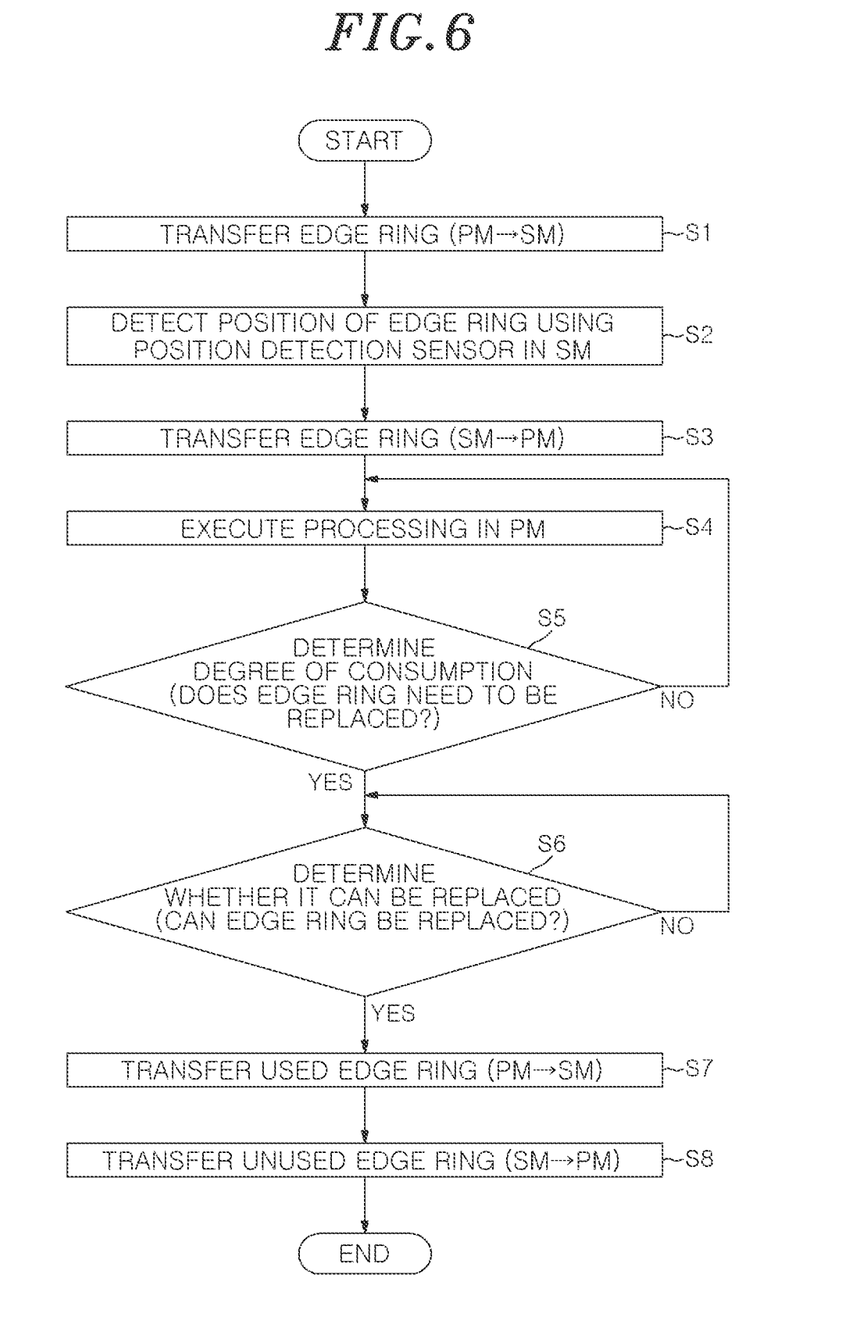
FIG. 6 is a diagram showing an example of a transfer method of an edge ring according to an embodiment.

An example of the transfer method of the edge ring 113 according to an embodiment will be described with reference to FIG. 6. A case of replacing the edge ring 113 installed in the process module PM7 of the processing system PS shown in FIG. 1 will be described below as an example. Also, the edge rings 113 installed in the process modules PM1 to PM6 and PM8 to PM12 may also be replaced by the same method.

The edge ring transfer method according to an embodiment is performed, for example, after the processing system PS is started and before processing by the processing system PS (process modules PM1 to PM12) is initiated. Also, the edge ring transfer method according to an embodiment is performed, for example, after the storage module SM is connected to the vacuum transfer module TM2 and before processing by the processing system PS (process modules PM1 to PM12) is initiated. However, the edge ring transfer method according to an embodiment may be performed at a timing different from the above.

First, the controller CU controls the transfer robot TR2 to transfer the edge ring 113 in the process module PM7 to the storage module SM and mount the edge ring 113 on the stage 73 in the storage module SM (step S1).

Subsequently, the controller CU calculates the position information of the edge ring 113 on the basis of a detection value of the line sensor 91 in the storage module SM (step S2). The position information includes a reference position of the process module PM7. For example, the reference position may be the center position P7(x7, y7) of the edge ring 113 that is installed in the process module PM7 with respect to the center position O(0, 0) of the stage 73. Also, the controller CU generates correspondence information having the position information matched to the identification information of the process module PM7 to which the edge ring 113 is mounted. For example, the correspondence information is recorded in the secondary memory device of the controller CU.

Subsequently, the controller CU controls the transfer robot TR2 to transfer the edge ring 113 mounted on the stage 73 to the process module PM7 and mount the edge ring 113 on the lower electrode 111 (step S3).

Subsequently, the controller CU performs various processes such as plasma processing on the process module PM7 while the edge ring 113 is installed in the process module PM7 (step S4). When various processes are performed on the process module PM7, the edge ring 113 in the process module PM7 is gradually scraped and consumed.

Subsequently, the controller CU performs consumption determination to determine whether the edge ring 113 in the process module PM7 needs to be replaced (step S5). For example, the controller CU determines whether the edge ring 113 needs to be replaced on the basis of the cumulative RF time, the cumulative RF power, the cumulative value of a specific step of a recipe, etc. The cumulative RF time is an accumulated value of the time during which RF power is supplied to the process module PM7 upon predetermined plasma processing. The cumulative RF power is an accumulated value of RF power which is supplied to the process module PM7 upon predetermined plasma processing. The cumulative value of a specific step of a recipe is an accumulated value of RF power or an accumulated value of the time when RF power is supplied in a step in which the edge ring 113 is scraped among processing steps performed on the process module PM7. Also, the cumulative RF time, the cumulative RF power and the cumulative value of a specific step of a recipe are calculated based on the point of time when the edge ring 113 is replaced, for example, when a device is introduced, when maintenance is executed, etc.

When determining whether the edge ring 113 needs to be replaced on the basis of the cumulative RF time, the controller CU determines that the edge ring 113 needs to be replaced when the cumulative RF time reaches a threshold. On the other hand, when the cumulative RF time does not reach the threshold, the controller CU determines that there is no need to replace the edge ring 113. Also, the threshold is a value determined by preliminary experiments or the like according to the type of material of the edge ring 113.

When determining whether the edge ring 113 needs to be replaced on the basis of the cumulative RF power, the controller CU determines that the edge ring 113 needs to be replaced when the cumulative RF power reaches a threshold. On the other hand, when the cumulative RF power does not reach the threshold, the controller CU determines that there is no need to replace the edge ring 113. Also, the threshold is a value determined by preliminary experiments or the like according to the type of material of the edge ring 113.

When determining whether the edge ring 113 needs to be replaced on the basis of the cumulative value of a specific step of a recipe, the controller CU determines that the edge ring 113 needs to be replaced when the cumulative RF time or the cumulative RF power in the specific step reaches the threshold. On the other hand, when the cumulative RF time or the cumulative RF power in the specific step does not reach the threshold, the controller CU determines that there is no need to replace the edge ring 113. When it is determined whether the edge ring 113 needs to be replaced on the basis of the cumulative value of a specific step of a recipe, RF power is applied and the controller CU may calculate the timing of replacing the edge ring 113 on the basis of the step in which the edge ring 113 is scraped. Thus, the controller CU may calculate the timing of replacing the edge ring 113 for the replacement of the edge ring 113 with high precision. Also, the threshold is a value determined by preliminary experiments or the like according to the type of material of the edge ring 113.

In step S5, when it is determined that the edge ring 113 in the process module PM7 needs to be replaced, the controller CU advances the process to step S6. On the other hand, in step S5, when it is determined that the edge ring 113 in the process module PM7 does not need to be replaced, the controller CU returns the process to step S4.

Subsequently, the controller CU performs replacement determination to determine whether the processing system PS is in a state in which the edge ring 113 can be replaced (step S6). For example, when the substrate is not processed in the process module PM7, which performs the replacement of the edge ring 113, the controller CU determines that the replacement of the edge ring 113 is available. On the other hand, when the substrate is being processed in the process module PM7, the controller CU determines that the replacement of the edge ring 113 is not available. Also, for example, when the processing of a substrate of the same lot as the substrate being processed in the process module PM7, which performs the replacement of the edge ring 113, is finished, the controller CU may determine that the replacement of the edge ring 113 is available. In this case, until the processing of a substrate of the same lot as the substrate being processed in the process module PM7 is finished, the controller CU determines that the replacement of the edge ring 113 is not available.

In step S6, when it is determined that the processing system PS is in a state in which the edge ring 113 can be replaced, the controller CU advances the process to step S7. Meanwhile, in step S7, when it is determined that the processing system PS is in a state in which the edge ring 113 cannot be replaced, the controller CU performs step S6 again.

Subsequently, the controller CU controls the transfer robot TR2 to transfer the edge ring 113 that has been already used in the process module PM7 to the storage module SM and store the edge ring 113 in the cassette 78 (step S7). A method of storing the used edge ring 113 in the cassette 78 will be described in detail below.

Subsequently, the controller CU controls the transfer robot TR2 to transfer an unused edge ring 113 stored in the cassette 78 to the process module PM7 and mount the unused edge ring on the lower electrode 111 in the process module PM7. In this case, the controller CU controls the transfer robot TR2 and performs position adjustment based on pre-generated correspondence information to mount the edge ring 113 on the lower electrode 111 in the process module PM7 in step S2. For example, when the transfer destination of the edge ring 113 is the process module PM7, the controller CU performs position adjustment with reference to the correspondence information generated in step S2 and on the basis of the position information corresponding to the identification information showing the process module PM7 so as to mount the edge ring 113 on the lower electrode 111. Subsequently, the controller CU ends the process. Also, in step S8, a case in which the unused edge ring 113 stored in the cassette 78 is transferred to the process module PM7 has been described, but the present invention is not limited thereto. For example, the unused edge ring 113 stored in the cassette 78 may be mounted on the stage 73, and a center position may be calculated by using the line sensor 91, position adjustment may be performed based on the position information corresponding to the identification information, and then the edge ring 113 may be mounted on the lower electrode 111. Thus, it is possible to improve the transfer precision of the edge ring 113.

As described above, according to an embodiment, the controller CU transfers the edge ring 113 in the process module PM7 to the storage module SM and measures a reference position of the process module PM7 by using the line sensor 91 in the storage module SM. Also, the controller CU controls the transfer robot TR2 and performs position adjustment based on the measured reference position of the process module PM7 to transfer the unused edge ring 113 to the process module PM7 and mount the edge ring 113 on the lower electrode 111. Thus, it is possible to mount the edge ring 113 on the lower electrode 111 in the process module PM7 with high precision. Therefore, it is not necessary to teach the transfer robot TR2 for each process module, and the time required for the teaching can be reduced.

Also, the controller CU may perform the position adjustment, which will be described below, when the unused edge ring 113 is transferred to the process module PM7 and mounted on the lower electrode 111.

First, the controller CU controls the transfer robot TR2 to transfer the used edge ring 113 in the process module PM7 to the storage module SM and mount the edge ring 113 on the stage 73 in the storage module SM. Subsequently, the controller CU calculates the position information of the used edge ring 113 on the basis of a detection value of the line sensor 91. The position information includes a deviation (a), which is a vector quantity. The deviation (a) is, for example, an assembly error in the process module PM7.

Subsequently, the controller CU controls the transfer robot TR2 to store the used edge ring 113 mounted on the stage 73 in the cassette 78.

Subsequently, the controller CU controls the transfer robot TR2 to store the unused edge ring 113 stored in the cassette 78 on the stage 73. Subsequently, the controller CU calculates the position information of the unused edge ring 113 on the basis of a detection value of the line sensor 91. The position information includes a deviation b, which is a vector quantity.

Subsequently, the controller CU controls the transfer robot TR2 to receive the unused edge ring 113 mounted on the stage 73, transfer the unused edge ring 113 to the process module PM7, and mount the edge ring 113 on the lower electrode 111 in the process module PM7.

Here, the controller CU controls the transfer robot TR2 to mount the unused edge ring 113 on the lower electrode 111 so as to absorb the amount of position deviation calculated based on the position information of the used edge ring 113 and the position information of the unused edge ring 113. The amount of position deviation may be, for example, a difference (b−a) between the deviation (a) and the deviation (b). Thus, it is possible to mount the unused edge ring 113 at a desired position on the lower electrode 111 in the process module PM7.

Also, the controller CU may control the transfer robot TR2 to receive the unused edge ring 113 mounted on the stage 73 so as to absorb the amount of position deviation calculated based on the position information of the unused edge ring 113 and the position information of the used edge ring 113. Thus, it is possible to mount the unused edge ring 113 at a desired position on the lower electrode 111 in the process module PM7.

Also, the controller CU may control the transfer robot TR2 to receive the unused edge ring 113 mounted on the stage 73 while the stage 73 is moved to absorb the amount of position deviation calculated based on the position information of the unused edge ring 113 and the position information of the used edge ring 113. Thus, it is possible to mount the unused edge ring 113 at a desired position on the lower electrode 111 in the process module PM7.

[Storage Method of Edge Ring]

Figure 7A:
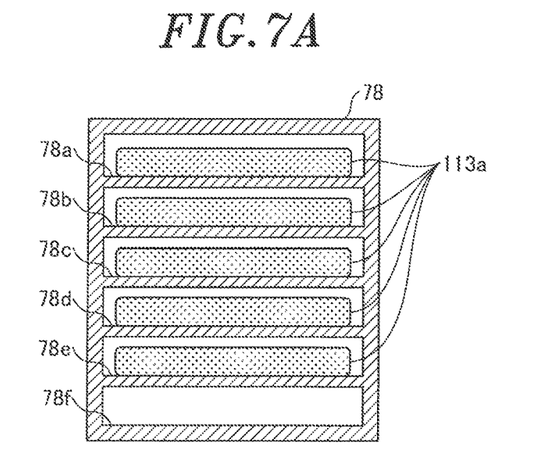
FIGS. 7A-7C are diagrams showing an example of a storage method of an edge ring according to an embodiment.

An example of the storage method of the edge ring 113 of an embodiment will be described with reference to FIGS. 4 and 7. The storage method of the edge ring 113 of an embodiment may be employed, for example, for the cassette 78 of the storage module SM when the edge ring 113 is imported and exported in steps S7 and S8 of the transfer method of the edge ring 113 of an embodiment.

A case in which an edge ring 113b used in the process module PM7 is stored in the cassette 78 and an unused edge ring 113a stored in the cassette 78 is transferred to the process module PM7 and then replaced will be described.

In the initial state of the storage module SM, the gate valve G4 and the door 80 are closed, and the pressure inside the chamber 70 is regulated by an inert gas, such as an $N_2$ gas. Also, the cassette 78 is mounted in the storage 75. In the cassette 78, as shown in FIG. 7A, six shelves 78a to 78f are installed in multiple stages, and unused edge rings 113a are stored on the upper five shelves 78a to 78e. Also, the lowermost shelf 78f is empty.

First, the controller CU raises and moves the storage 75 to a first position. The first position is, for example, a position where the lowermost shelf 78f of the cassette 78 in the storage 75 is opposite to the gate valve G4.

When the storage 75 is moved to the first position, the controller CU depressurizes the chamber 70 using the exhaust 72 to make the pressure in the chamber 70 less than the pressure in the vacuum transfer module TM2. For example, the controller CU adjusts the pressure in the chamber 70 to less than 50 mTorr (6.7 Pa) and adjusts the pressure in the vacuum transfer module TM2 to 50 mTorr (6.7 Pa) to 100 mTorr (13.3 Pa).

Subsequently, the controller CU opens the gate valve G4. At this time, since the pressure in the chamber 70 is lower than the pressure in the vacuum transfer module TM2, an air flow is formed from the vacuum transfer module TM2 toward the exhaust port 71 installed on the bottom of the chamber 70.

Figure 7B:
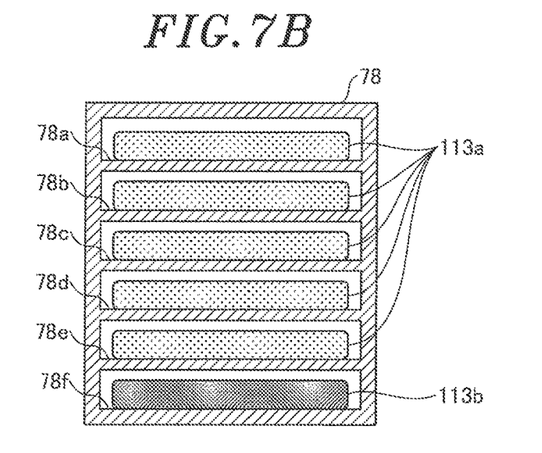

Subsequently, the controller CU controls the transfer robot TR2 to store the edge ring 113 used in the process module PM7 in the lowermost shelf 78f of the cassette 78 as shown in FIG. 7B. At this time, contaminants such as particles may adhere to the used edge ring 113b, but the used edge ring 113b is mounted on the lowermost shelf 78f. Therefore, the contaminants adhering to the used edge ring 113b are prevented from adhering to the unused edge rings 113a stored in the shelves 78a to 78e above the shelf 78f. Also, an air flow in the chamber 70 is formed from the vacuum transfer module TM2 toward the exhaust port 71 installed on the bottom of the chamber 70. As a result, the contaminants adhering to the used edge ring 113b are discharged from the exhaust port 71 by the air flow directed to the exhaust port 71. As a result, the contaminants adhering to the used edge ring 113b are prevented from adhering to the unused edge rings 113a stored in the shelves 78a to 78e above the shelf 78f. Thus, even when the unused edge ring 113a and the used edge ring 113b are mingled in the cassette 78, it is possible to prevent the unused edge ring 113a from being contaminated.

Subsequently, the controller CU lowers and moves the storage 75 to a second position. The second position is, for example, a position where the second shelf 78e from the bottom of the cassette 78 in the storage 75 is opposite to the gate valve G4.

Figure 7C:
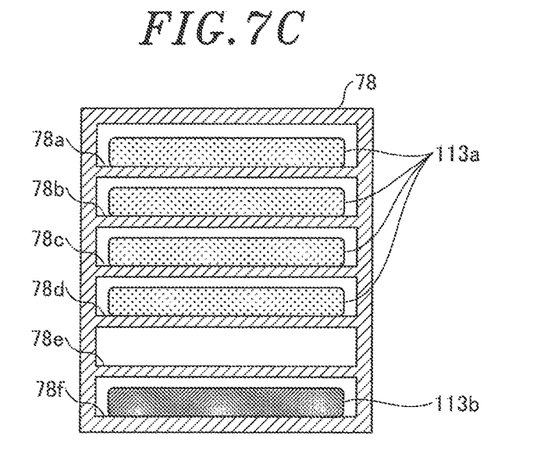

When the storage 75 is moved to the second position, the controller CU controls the transfer robot TR2 to acquire the unused edge ring 113a from the shelf 78e and transfer the unused edge ring 113a to the process module PM7 as shown in FIG. 7C. Subsequently, the controller CU closes the gate valve G4.

As described above, the edge ring 113b used in the process module PM7 is replaced with the unused edge ring 113a. Also, when the edge rings 113b used in the other process modules PM1 to PM6 and PM8 to PM12 are subsequently replaced with unused edge rings 113a, the replacement may be performed in order from the bottom of the cassette 78, as described above. As a result, it is possible to prevent an unused edge ring 113a from being contaminated.

[Installation Example of Storage Module]

An installation example of the storage module SM will be described with reference to FIGS. 1, 3, 4, and 8.

Figure 8:
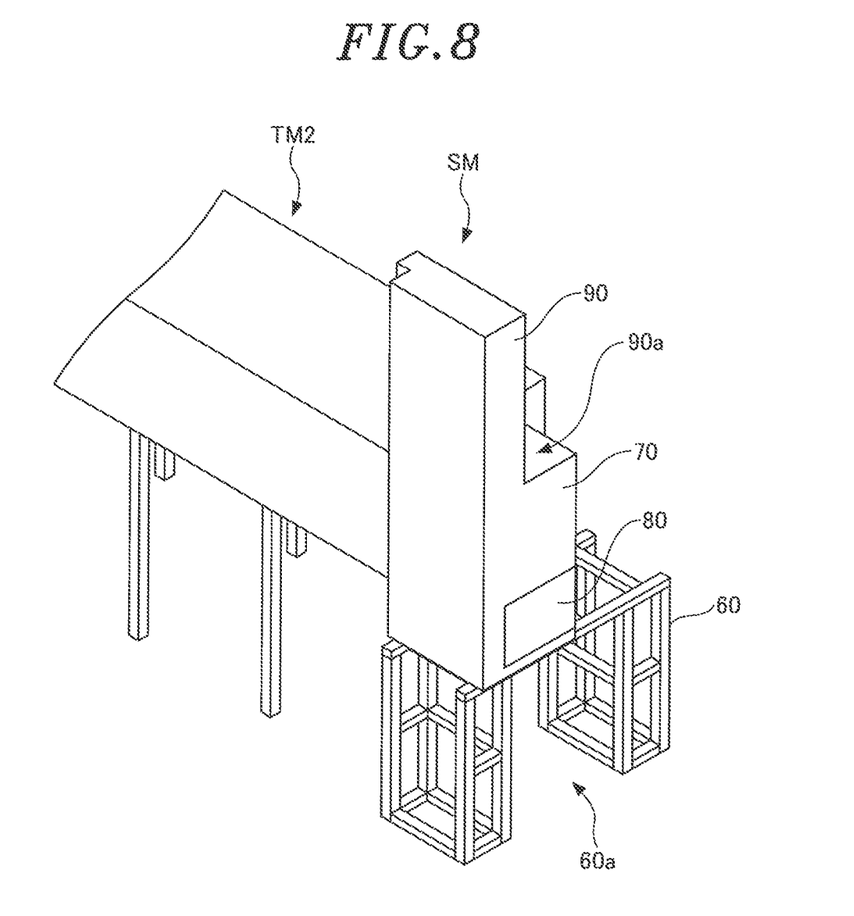
FIG. 8 is a schematic diagram showing an installation example of a storage module.

The storage module SM is connected to the side of the vacuum transfer module TM2 opposite to the side to which the vacuum transfer module TM1 is connected. The storage module SM includes a frame 60, a chamber 70 and a mechanical room 90, as described above.

The frame 60 supports the chamber 70. For example, the frame 60 is arranged in the lateral direction of the vacuum transfer module TM2 and configured to support two chambers 70. In the example of FIG. 8, it is shown that one chamber 70 is installed on the frame 60. The frame 60 forms a passage 60a below the chamber 70. As a result, an operator can access lower portions of the process modules PM1 to PM12 and the vacuum transfer modules TM1 and TM2 through the lower passage 60a of the chamber 70. Therefore, the maintainability of the vacuum transfer modules TM1 and TM2 and the process modules PM1 to PM12, etc. are improved.

The chamber 70 is installed on the frame 60. A door 80 is installed on the surface of the chamber 70 opposite to the surface connected to the vacuum transfer module TM2. The door 80 is opened or closed, for example, when the cassette 78 is taken out from the chamber 70 or when the cassette 78 is installed in the chamber 70.

The mechanical room 90 is installed above the chamber 70. In the example of FIG. 8, the mechanical room 90 is installed in a portion above the chamber 70, and the passage 90a is formed by the remaining area above the chamber 70. As a result, an operator can access upper portions of the process modules PM1 to PM12 and the vacuum transfer modules TM1 and TM2 through the upper passage 90a of the chamber 70. Therefore, the maintainability of the vacuum transfer modules TM1 and TM2 and the process modules PM1 to PM12, etc. are improved.

The embodiments disclosed herein should be considered to be exemplary in all respects and not restrictive. The above embodiments may be omitted, replaced, or modified in various forms without departing from the scope and gist of the appended claims.

In the above embodiments, the case in which an edge ring is transferred between the storage module and the process module has been described, but the present disclosure is not limited thereto. For example, the present disclosure may also be applied to the case in which other consumable members installed in the process module, e.g., a cover ring, a top plate of an upper electrode, an electrostatic chuck (ESC), and the like are transferred instead of an edge ring. Also, the edge ring may be a jig for position adjustment.

In the above embodiments, the case in which the line sensor 91, which is an example of the location detection sensor, is installed in the storage module SM, has been described, but the present disclosure is not limited thereto. The position detection sensor may be installed at a location different from the storage module SM, for example, a fork FK1 placed at the tip of the transfer robot TR1, a fork placed at the tip of the transfer robot TR2, the gate valves G1 to G4, and the vacuum transfer modules TM1 and TM2.

Figure 9A:
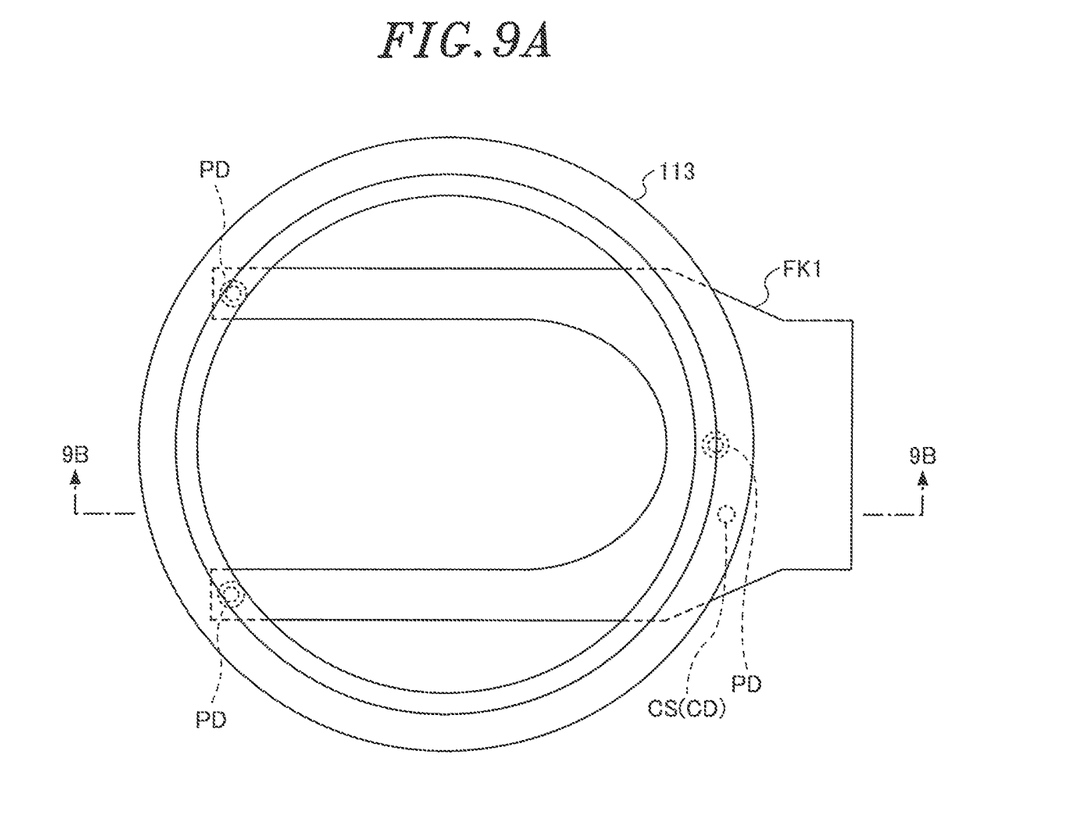
FIGS. 9A and 9B are diagrams showing a position detection sensor installed on a fork of a transfer robot.
Figure 9B:
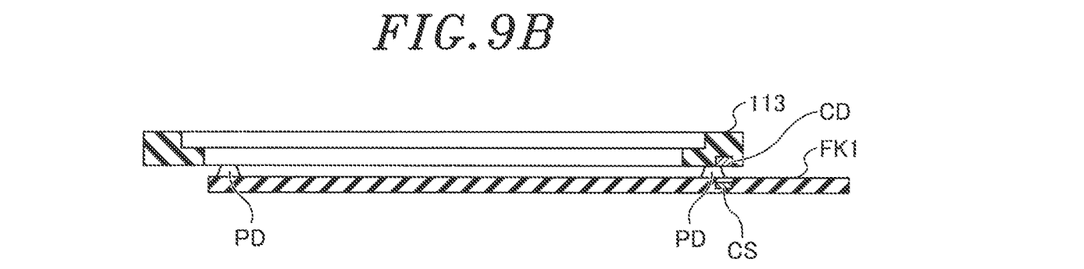

FIG. 9 is a diagram showing a position detection sensor installed on the fork FK1 of the transfer robot TR1. FIG. 9A is a plan view of the fork FK1 holding the edge ring 113, and FIG. 9B is a cross-sectional view taken along the line 9B-9B of FIG. 9A. As shown in FIG. 9A, the fork FK1 is approximately U-shaped in a plan view. The fork FK1 includes three pads PD and a capacitance sensor CS. The pads PD are, for example, formed in truncated cone shapes and are arranged along the inner peripheral edge of the edge ring 113. The pads PD hold the edge ring 113 by bringing the upper surface of the truncated cone shape into contact with the lower surface of the edge ring 113. The capacitance sensor CS is embedded in, for example, the base end of the fork FK1. When the edge ring 113 is installed at a predetermined position (for example, the center position) of the fork FK1, a conductor CD is installed at a position where the center of the edge ring 113 coincides with the center of the capacitance sensor CS in a plan view. The conductor CD is, for example, aluminum. When the edge ring 113 is held by the fork FK1, the capacitance sensor CS detects the capacitance according to the positional relationship with the conductor CD installed at the edge ring 113 and outputs the detection value (the detection result) to the controller CU. Subsequently, the controller CU calculates the position information of the edge ring 113 on the basis of the detection value of the capacitance sensor CS. The capacitance sensor CS and the conductor CD are examples of the position detection sensor.

The invention claimed is:

1. A processing system comprising:
   a chamber in which a consumable member is installed;
   a storage module configured to store the consumable member;
   a position detection sensor located in the storage module and configured to detect a reference position of the consumable member, the reference position including position information corresponding to positioning of the consumable member in the chamber in which the consumable was positioned prior to transfer of the consumable member to the storage module;
   a vacuum transfer module connected to the chamber and the storage module, the vacuum transfer module having a transfer robot configured to transfer the consumable member between the chamber and the storage module; and
   a controller,
   wherein the controller is configured to perform processes of:
   (a) controlling the transfer robot to transfer the consumable member installed in the chamber to the storage module;
   (b) detecting the reference position of the consumable member transferred to the storage module by the position detection sensor; and
   (c) controlling the transfer robot to transfer a new consumable member different from the consumable member from the storage module to the chamber at a position adjusted based on the reference position of the consumable member detected in the process (b).

2. The processing system of claim 1, wherein the controller is configured to perform the process (a) after the consumable member is installed in the chamber and before processing is performed inside the chamber.

3. The processing system of claim 1, wherein the storage module is detachable from the vacuum transfer module.

4. The processing system of claim 3, wherein the controller is configured to perform the process (a) after the storage module is connected to the vacuum transfer module and before processing is performed inside the chamber.

5. The processing system of claim 1, wherein
the storage module has an exhaust port for depressurizing an inside of the storage module, and
the controller is configured to further perform a process of
(d) depressurizing the inside of the storage module through the exhaust port so that the inside of the storage module has a pressure lower than that of an inside of the vacuum transfer module and communicating the inside of the storage module with the inside of the vacuum transfer module.

6. The processing system of claim 1, wherein the position detection sensor detects a horizontal position of the consumable member.

7. The processing system of claim 1, wherein
the storage module stores a plurality of the consumable members at intervals in a vertical direction, and
the controller is configured to further perform a process of
(e) storing the consumable member used inside the chamber below the new consumable member stored inside the storage module before the process (c).

8. The processing system of claim 1, wherein
the consumable member has an annular shape, and
the position detection sensor comprises an inner circumference sensor that detects an inner circumference reference position of the consumable member and an outer circumference sensor that detects an outer circumference reference position of the consumable member.

9. The processing system of claim 1, wherein the consumable member includes an edge ring installed inside the chamber and mounted on an upper surface of a mounting table on which a substrate is mounted so as to surround the substrate.

10. The processing system of claim 1, wherein the new consumable member is an unused consumable member.

11. The processing system according to claim 1, wherein the position detection sensor is configured to detect a center position of the consumable member to provide at least part of the reference position.

12. The processing system according to claim 11, wherein the position detection sensor is configured to detect a circumference of the consumable member to provide at least part of the reference position.

13. The processing system according to claim 1, wherein the storage module includes:
a plurality of storage locations which store used or unused consumable members; and
a stage, separate from the plurality of storage locations, wherein the position detection sensor is positioned and configured to detect the reference position with the consumable member mounted on the stage.

14. The processing system according to claim 13, wherein the position detection sensor is configured to detect at least one of a center position of the consumable member mounted on the stage and a circumference position of the consumable member mounted on the stage to provide at least part of the reference position.

15. The processing system according to claim 14, wherein the stage is configured to move rotationally and/or horizontally to different positions as the position detection sensor collects information of the reference position.

16. The processing system according to claim 13, wherein the position detection sensor is configured to detect the reference position with respect to a plan view of the consumable member.

17. The processing system according to claim 16, wherein the system further includes:
a number detection sensor, separate from the position detection sensor, which detects a number of used and/or unused consumable members in the plurality of storage locations.

18. A method of transferring a consumable member in a processing system including a chamber in which a consumable member is installed, a storage module configured to store the consumable member, a position detection sensor located in the storage module and configured to detect a reference position of the consumable member, the reference position including position information corresponding to positioning of the consumable member in the chamber in which the consumable member was positioned prior to transfer of the consumable member to the storage module, and a vacuum transfer module connected to the chamber and the storage module, the vacuum transfer module having a transfer robot configured to transfer the consumable member between the chamber and the storage module, the method comprising processes of:
(a) transferring the consumable member installed in the chamber to the storage module by the transfer robot;
(b) detecting the reference position of the consumable member transferred to the storage module by the position detection sensor; and
(c) transferring a new consumable member different from the consumable member from the storage module to the chamber by the transfer robot at a position adjusted based on the reference position of the consumable member detected in the process (b).

* * * * *